United States Patent
Kim et al.

(10) Patent No.: US 10,138,125 B2
(45) Date of Patent: Nov. 27, 2018

(54) ELECTRICALLY CONDUCTIVE THIN FILMS

(71) Applicant: SAMSUNG ELECTRONICS CO., LTD., Suwon-si, Gyeonggi-do (KR)

(72) Inventors: Sang Il Kim, Seoul (KR); Se Yun Kim, Seoul (KR); Kyoung-Seok Moon, Hwaseong-si (KR); Sung Woo Hwang, Seoul (KR); Yoon Chul Son, Hwaseong-si (KR); Hyosug Lee, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 220 days.

(21) Appl. No.: 14/732,951

(22) Filed: Jun. 8, 2015

(65) Prior Publication Data
US 2015/0360944 A1    Dec. 17, 2015

(30) Foreign Application Priority Data
Jun. 11, 2014 (KR) .................. 10-2014-0071059

(51) Int. Cl.
| | |
|---|---|
| C01B 19/04 | (2006.01) |
| C03C 17/10 | (2006.01) |
| C30B 29/46 | (2006.01) |
| H01B 1/02 | (2006.01) |
| H01B 1/06 | (2006.01) |

(52) U.S. Cl.
CPC ............. C01B 19/04 (2013.01); C03C 17/10 (2013.01); C30B 29/46 (2013.01); H01B 1/02 (2013.01); H01B 1/06 (2013.01); *C01P 2006/40* (2013.01)

(58) Field of Classification Search
CPC ................................... C01B 19/04
See application file for complete search history.

(56) References Cited

U.S. PATENT DOCUMENTS

| | | |
|---|---|---|
| 4,233,375 A | 11/1980 | Whittingham et al. |
| 7,989,280 B2 | 8/2011 | Brask et al. |
| 2004/0021921 A1* | 2/2004 | Richardson ........... G02F 1/1523 359/265 |

(Continued)

FOREIGN PATENT DOCUMENTS

| | | |
|---|---|---|
| JP | 06-150910 A | 5/1994 |
| JP | 10-241661 A | 9/1998 |
| KR | 1020130037483 A | 4/2013 |

OTHER PUBLICATIONS

Koike et al., "Log T Dependence of Resistivity and Negative Magnetoresistance in the Layered Compound TiTe2," Journal of the Physical Society of Japan 52(2), pp. 597-604, Feb. 1983.*

(Continued)

*Primary Examiner* — Colin W. Slifka
(74) *Attorney, Agent, or Firm* — Cantor Colburn LLP

(57) ABSTRACT

An electrically conductive thin film including a compound represented by Chemical Formula 1 or Chemical Formula 2 and having a layered crystal structure:

$$M^1Te_2 \quad \text{Chemical Formula 1}$$

wherein $M^1$ is titanium (Ti), zirconium (Zr), hafnium (Hf), vanadium (V), tantalum (Ta), or niobium (Nb); and $$M^2Se_2 \quad \text{Chemical Formula 2}$$

wherein $M^2$ is vanadium (V) or tantalum (Ta).

21 Claims, 14 Drawing Sheets

(56) References Cited

U.S. PATENT DOCUMENTS

| | | |
|---|---|---|
| 2004/0026730 A1 | 2/2004 | Kostylev et al. |
| 2004/0026731 A1 | 2/2004 | Fournier et al. |
| 2004/0178414 A1* | 9/2004 | Frey .................... H01L 51/5206 257/79 |
| 2007/0284622 A1 | 12/2007 | Ryoo et al. |
| 2009/0266419 A1 | 10/2009 | Koumura et al. |
| 2013/0233382 A1 | 9/2013 | Kobayashi et al. |
| 2013/0302593 A1* | 11/2013 | Coleman ................ C01G 35/00 428/323 |
| 2014/0212672 A1 | 7/2014 | Han et al. |

OTHER PUBLICATIONS

Khan et al., "Anomalous electron transport in back-gated field-effect transistors with $TiTe_2$ semimetal thin-film channels," Applied Physics Letters 100 043109, Jan. 2012.*
"The surface and domain structure of $NbTe_2$," Cukjati et al, Journal of Crystal Growth 237-239, pp. 278-282 (Year: 2002).*
Extended European Search Report dated Oct. 13, 2015.
Kim et al., "Color of TiN ZrN from first-principles calculations", Journal of Applied Physics, vol. 110, 2011, 083501-1-083501-5.

* cited by examiner

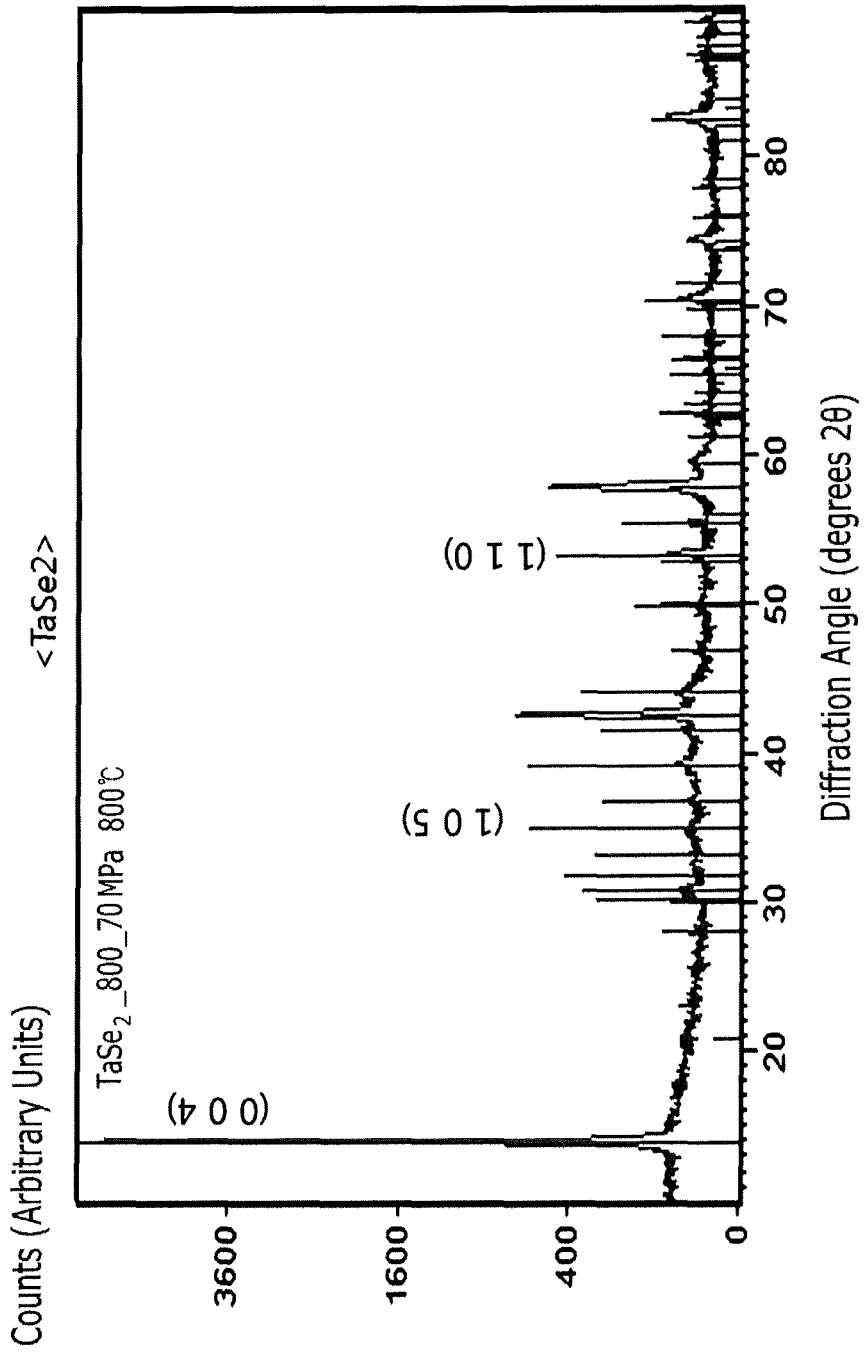

ELECTRICALLY CONDUCTIVE THIN FILMS

CROSS-REFERENCE TO RELATED APPLICATIONS

This application claims priority to and the benefit of Korean Patent Application No. 10-2014-0071059, filed in the Korean Intellectual Property Office on Jun. 11, 2014, and all the benefits accruing therefrom under 35 U.S.C. § 119, the entire content of which is incorporated herein by reference.

BACKGROUND

1. Field

Electrically conductive thin films and an electronic device including the same are disclosed.

2. Description of the Related Art

An electronic device, such as a LCD or LED flat panel display, a touch screen panel, a solar cell, a transparent transistor, and the like includes an electrically conductive thin film which may be transparent. A material for an electrically conductive thin film desirably has a light transmittance of greater than or equal to about 80% in a visible light region and a specific resistance of less than or equal to about 100 microohm-centimeters ($\mu\Omega$*cm). The currently-used materials for an electrically conductive thin film include indium tin oxide (ITO), tin oxide ($SnO_2$), zinc oxide (ZnO), and the like. The ITO material has poor flexibility and inevitably costs more due to limited reserves of indium. Therefore, development of an alternative material is needed. Tin oxide and zinc oxide have lower conductivity and have poor flexibility.

Developing a material for a flexible and stable transparent electrode having high transparency and excellent electrical conductivity is desired for a flexible electronic device, such as bendable or foldable electronic device, which has been drawing growing attention as a next generation electronic device.

SUMMARY

An embodiment provides a flexible and electrically conductive thin film having high conductivity and excellent light transmittance.

Another embodiment provides an electronic device including the electrically conductive thin film.

In an embodiment, an electrically conductive thin film includes a compound represented by Chemical Formula 1 or Chemical Formula 2 and having a layered crystal structure:

Chemical Formula 1 wherein $M^1$ is titanium (Ti), zirconium (Zr), hafnium (Hf), vanadium (V), tantalum (Ta), or niobium (Nb); or

Chemical Formula 2 wherein $M^2$ is vanadium (V) or tantalum (Ta).

The electrically conductive thin film may have transmittance of greater than or equal to about 50% for light having a wavelength of about 550 nm at a film thickness of about 10 nm.

The compound may include $TiTe_2$, $NbTe_2$, $TaTe_2$, or a combination thereof.

The electrically conductive thin film may include a monocrystal of the compound.

The electrically conductive thin film may have an electrical conductivity of greater than or equal to about 2200 S/cm.

The compound may have a product of an absorption coefficient ($\alpha$) for light having a wavelength of about 550 nm at 25° C. and a resistivity value ($\rho$) thereof of less than or equal to about 30$\Omega$/□.

The layered crystal structure may belong to a hexagonal system and may be in space group P-3m1 (164) or may belong to a monoclinic system and may be in space group C12/m1 (12).

The electrically conductive thin film may include a plurality of nanosheets including the compound, and the nanosheets may contact each other to provide an electrical connection.

The electrically conductive thin film may include a continuous deposition film including the compound.

The electrically conductive thin film may have transmittance of greater than or equal to about 80% for light having a wavelength of about 550 nm at a film thickness of about 10 nm.

Another embodiment provides an electronic device including an electrically conductive thin film including a compound represented by Chemical Formula 1 or Chemical Formula 2 and having a layered crystal structure:

Chemical Formula 1 wherein $M^1$ is titanium (Ti), zirconium (Zr), hafnium (Hf), vanadium (V), tantalum (Ta), or niobium (Nb); or

Chemical Formula 2 wherein $M^2$ is vanadium (V) or tantalum (Ta).

The electronic device may be a flat panel display, a touch screen panel, a solar cell, an e-window, an electrochromic mirror, a heat mirror, a transparent transistor, or a flexible display.

According to an embodiment, it becomes possible to provide a transparent and conductive material having a conductivity comparable to or greater than that of the ITO and improved visible light transmittance.

BRIEF DESCRIPTION OF THE DRAWINGS

The above and other aspects, advantages and features of this disclosure will become more apparent by describing in further detail exemplary embodiments thereof with reference to the accompanying drawings, in which.

Figure 2A:
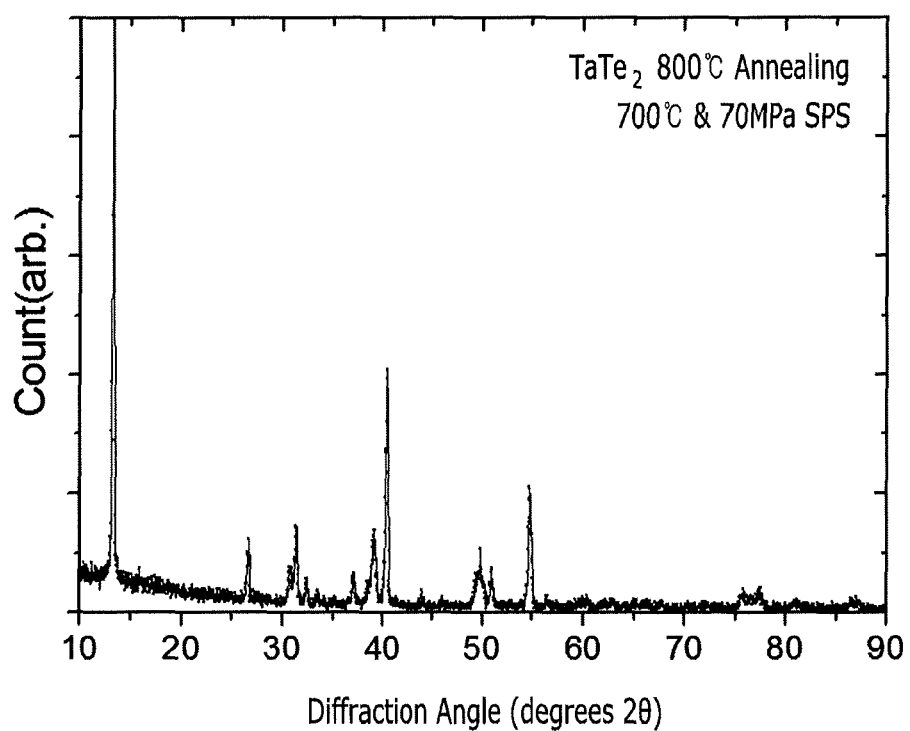
Figure 2B:
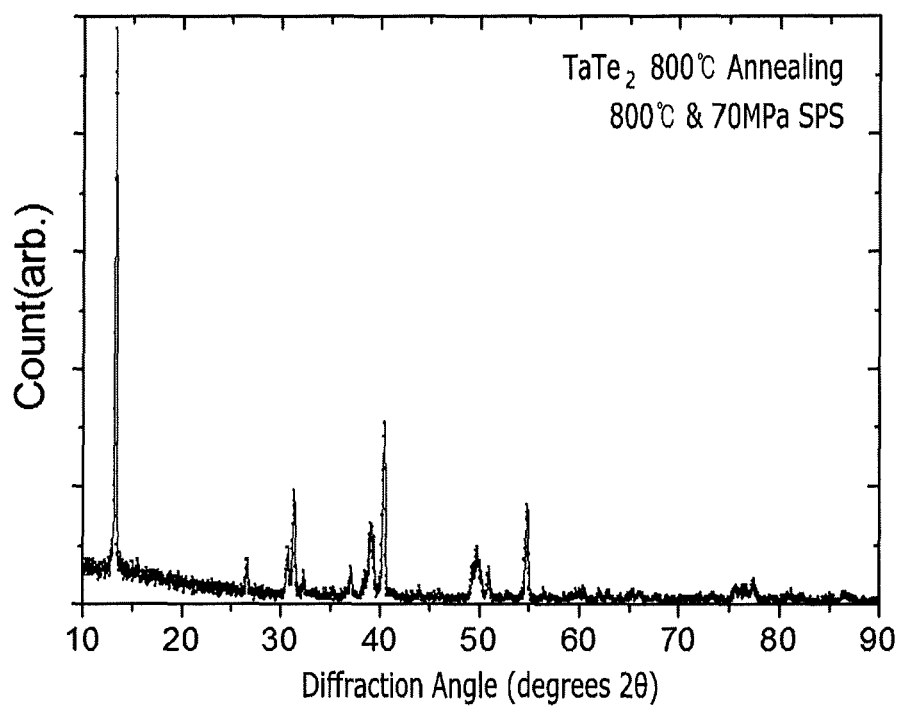
Figure 2C:
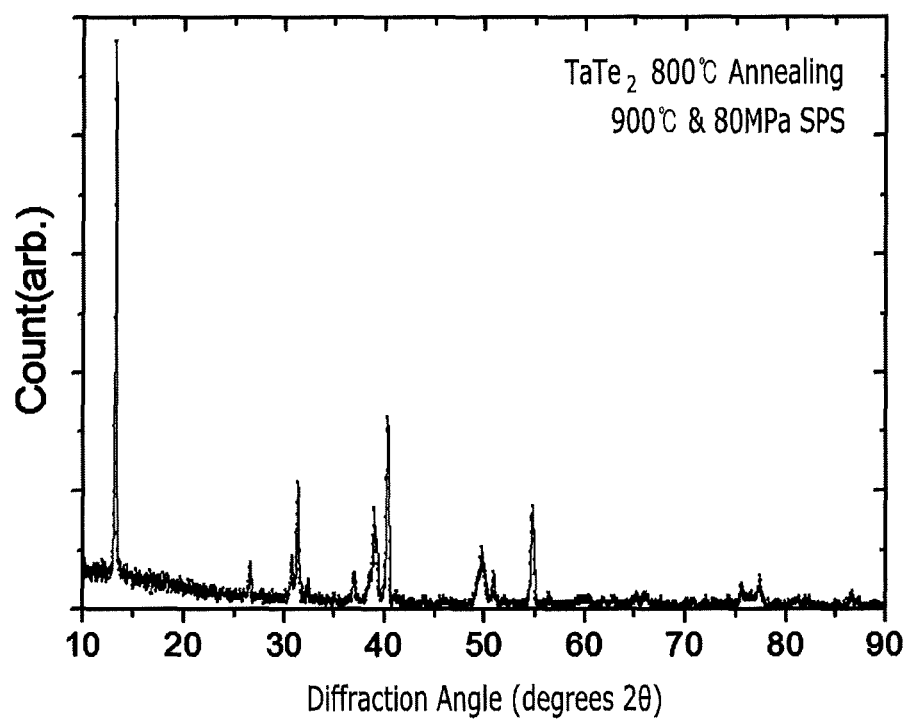
Figure 4:
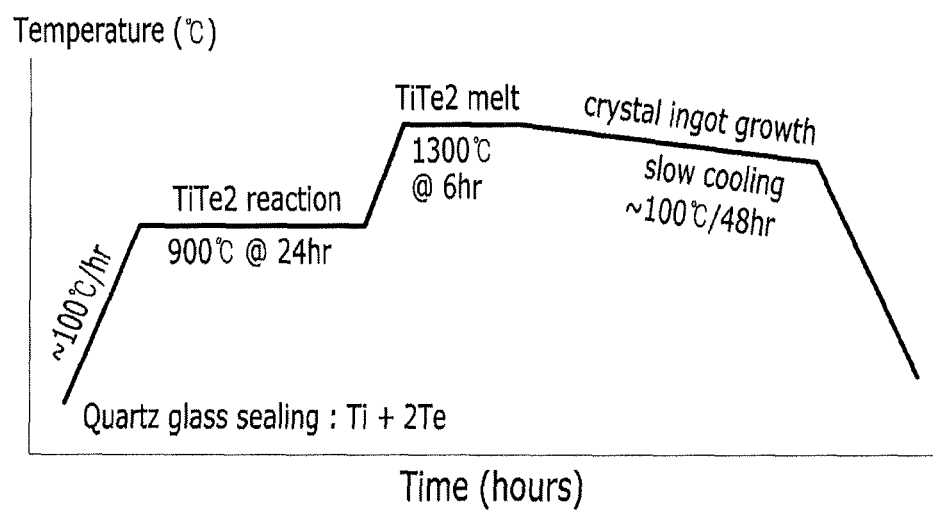
Figure 5:
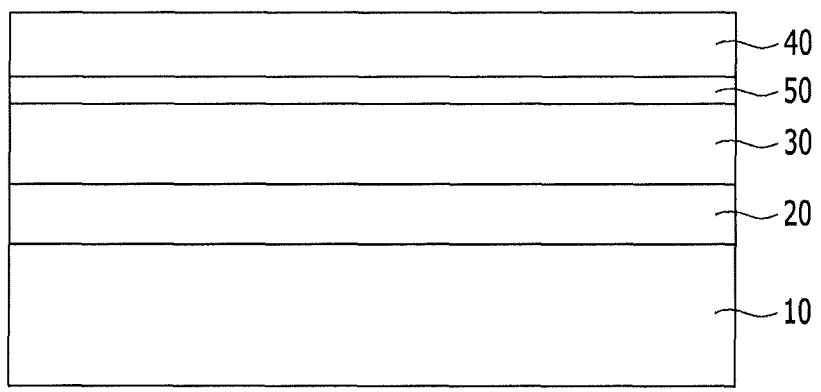
Figure 6A:
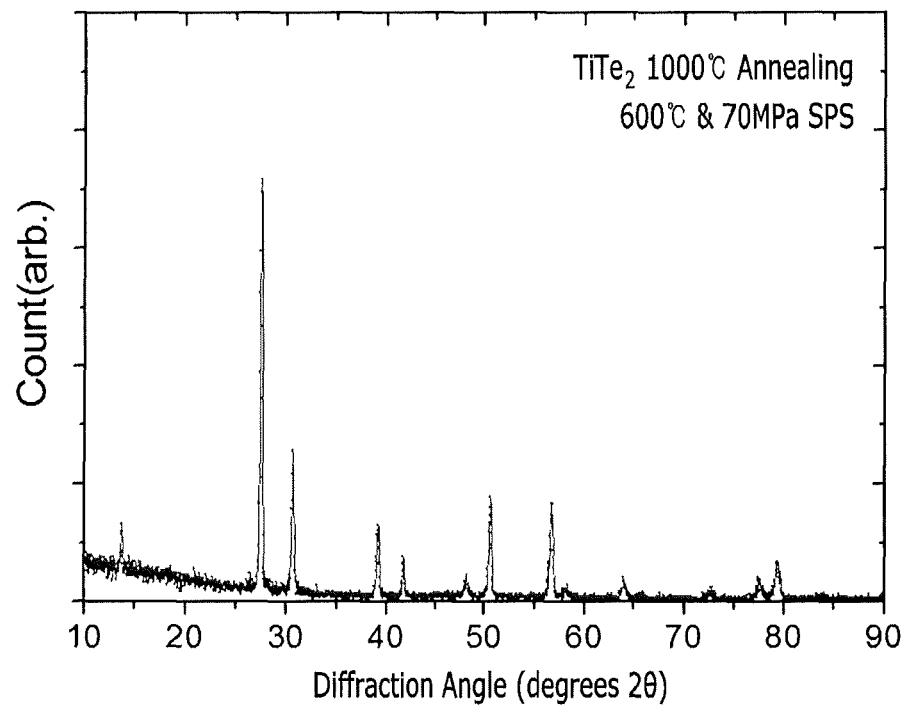
Figure 6B:
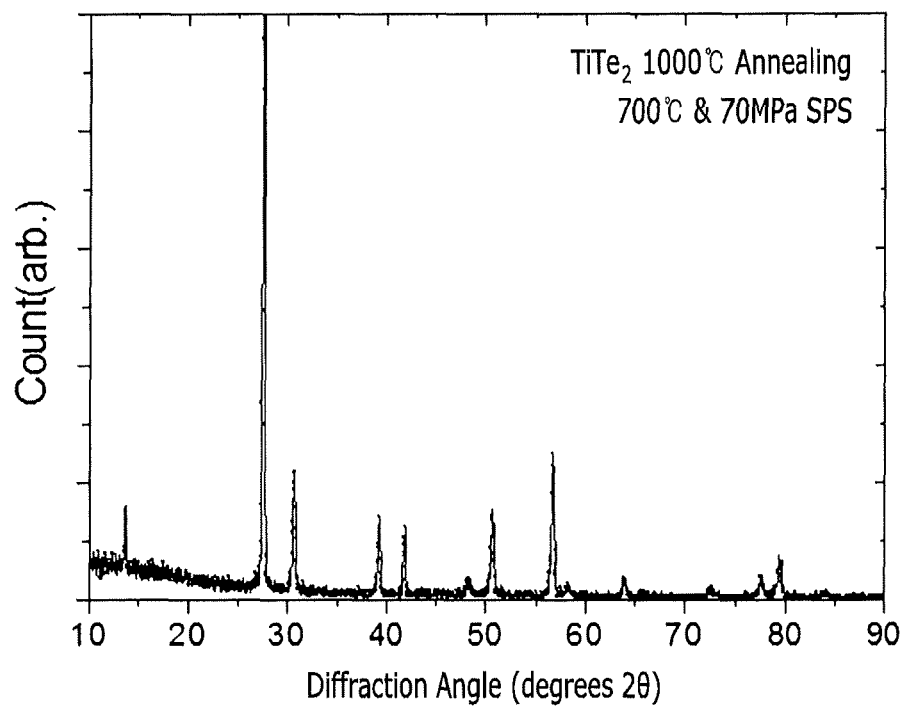
Figure 6C:
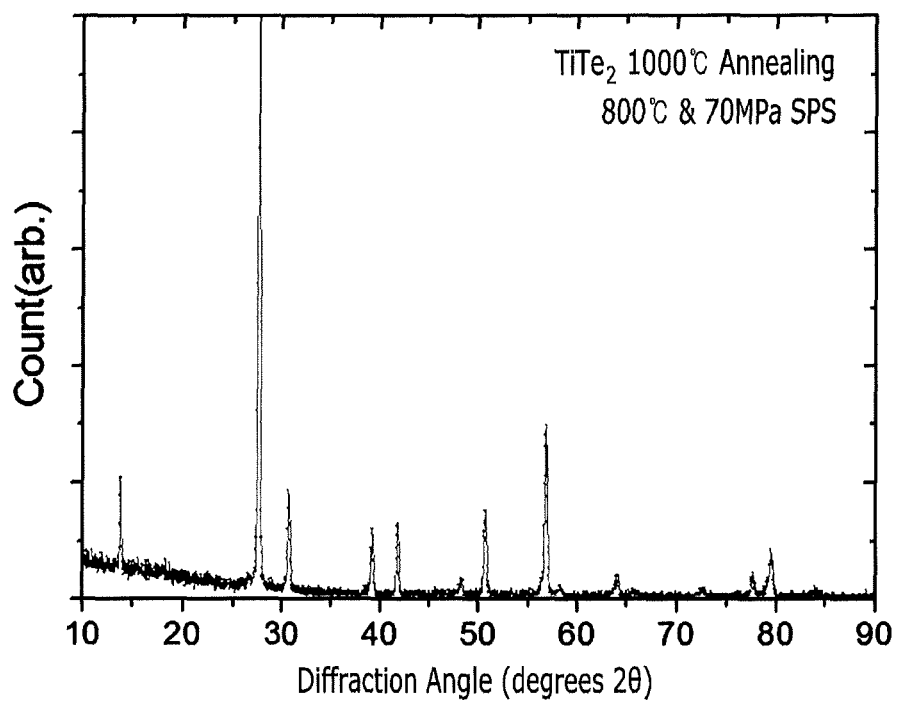
Figure 7A:
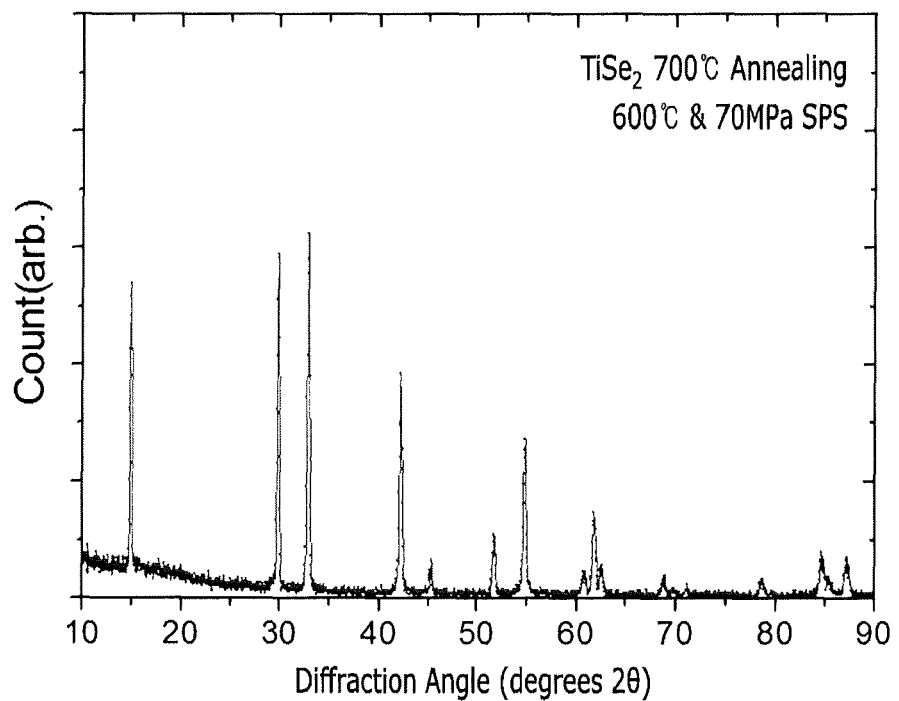
Figure 7B:
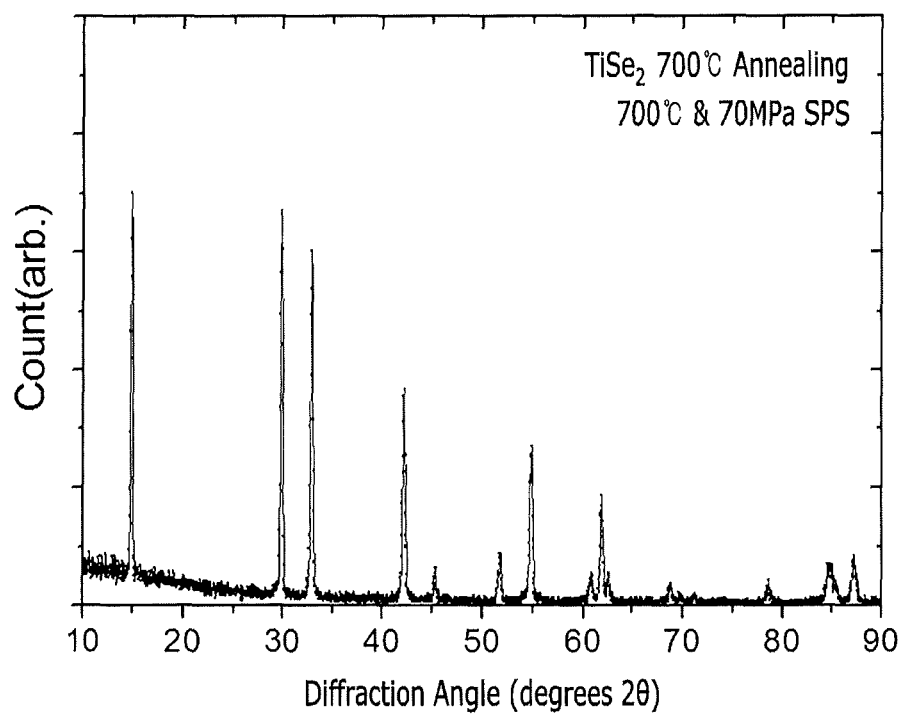
Figure 7C:
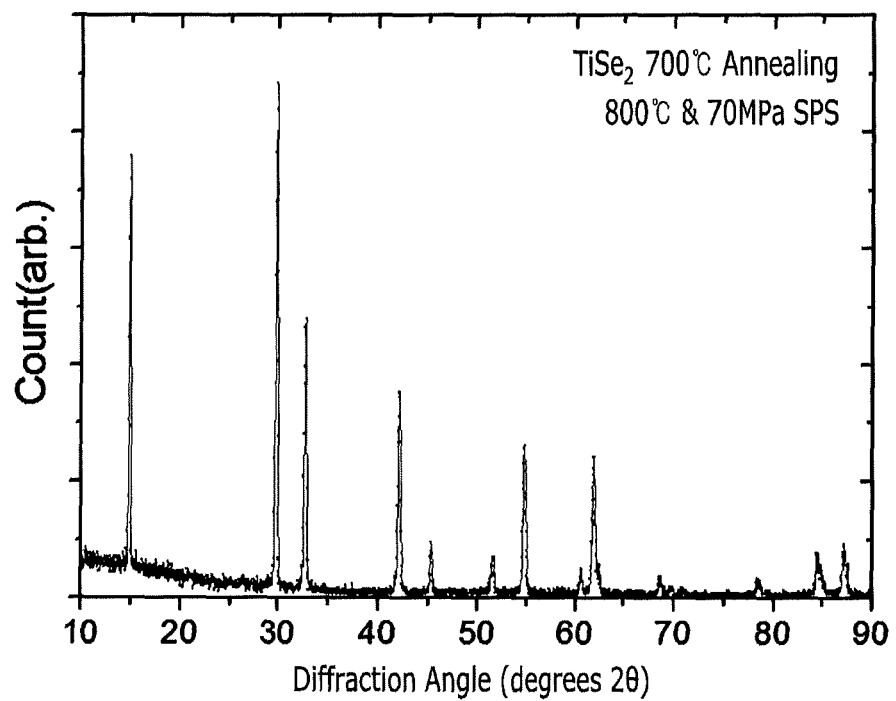
Figure 7D:
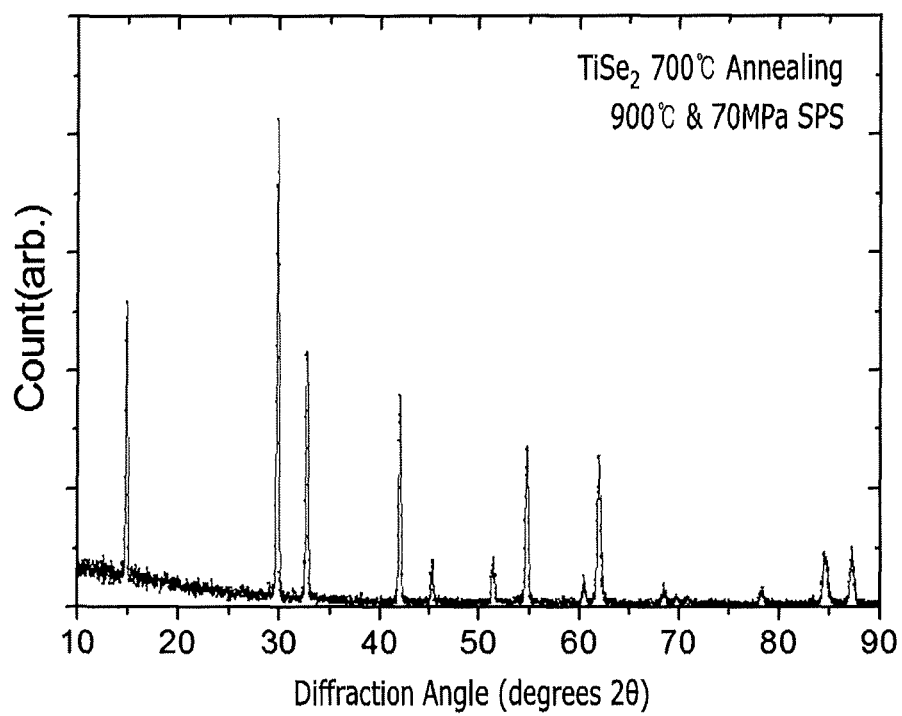

Each of FIG. 2A, FIG. 2B, and FIG. 2C are each a graph of counts (arbitrary units) versus diffraction angle (degrees two-theta, 2θ) and are X-ray diffraction spectra of $TaTe_2$ polycrystalline sintered bodies prepared in Example 6 at 700° C., 800° C., and 900° C., respectively;

FIG. 3 is a graph of counts (arbitrary units) versus diffraction angle (degrees two-theta, 2θ) and is an X-ray diffraction spectrum of a $TaSe_2$ polycrystalline sintered body prepared in Example 8;

FIG. 4 is a schematic illustration of a process used to prepare a monocrystalline compound in Example 9;

FIG. 5 is a cross-sectional view of an embodiment of an organic light emitting diode device including an embodiment of an electrically conductive thin film;

FIG. 6A, FIG. 6B, and FIG. 6C are each a graph of counts (arbitrary units) versus diffraction angle (degrees two-theta, 2θ) and are X-ray diffraction spectra of TiTe$_2$ polycrystalline sintered bodies prepared in Example 1 at 600° C., 700° C., and 800° C., respectively; and FIG. 7A, FIG. 7B, FIG. 7C, and FIG. 7D are each a graph of counts (arbitrary units) versus diffraction angle (degrees two-theta, 2θ) and are X-ray diffraction spectra of TiSe$_2$ polycrystalline sintered bodies prepared in Comparative Example 3 at 600° C., 700° C., 800° C., and 900° C. respectively.

DETAILED DESCRIPTION

Advantages and characteristics of this disclosure, and a method for achieving the same, will become evident referring to the following embodiments together with the drawings attached hereto. However, this disclosure may be embodied in many different forms and is not be construed as limited to the embodiments set forth herein; rather, these embodiments are provided so that this disclosure will fully convey the scope of the invention to those skilled in the art. Therefore, in some embodiments, well-known process technologies are not explained in detail for clarity. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

The singular includes the plural unless mentioned otherwise, and thus the singular forms "a," "an," and "the" are intended to include the plural forms, including "at least one," unless the content clearly indicates otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"Or" means "and/or." As used herein, the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In an embodiment, an electrically conductive thin film includes a compound represented by Chemical Formula 1 or Chemical Formula 2 and having a layered crystal structure:

$$M^1Te_2 \quad \text{Chemical Formula 1}$$

wherein $M^1$ is titanium (Ti), zirconium (Zr), hafnium (Hf), vanadium (V), tantalum (Ta), or niobium (Nb); and

$$M^2Se_2 \quad \text{Chemical Formula 2}$$

wherein $M^2$ is vanadium (V) or tantalum (Ta).

The compound may include TiTe$_2$, NbTe$_2$, TaTe$_2$, or a combination thereof. In an embodiment, the electrically conductive thin film may include a monocrystalline compound or a polycrystalline compound. A monocrystalline film having a thickness of about 1 nm to about 50 nm, or about 2 to about 30 nm, is specifically mentioned.

The electrically conductive thin film may be a transparent thin film. For example, the electrically conductive thin film may have transmittance of greater than or equal to about 50 percent (%), for example greater than or equal to about 60%, greater than or equal to about 70%, greater than or equal to about 75%, or greater than or equal to about 80%, or about 50% to about 99%, or about 60% to about 95%, for light having a wavelength of about 550 nanometers (nm) at a film thickness of about 10 nm.

Transition metal dichalcogenides, such as MoS$_2$ and MoSe$_2$, may have an electrical conductivity of a semiconductor material but are not commonly utilized for a transparent electrical film, such as a transparent electrode, because their transmittance is poor. In contrast, the transition metal compound being represented by Chemical Formula 1 or Chemical Formula 2 and having a layered crystal structure may have high electrical conductivity, and at the same time, it may provide high transmittance when it is prepared as a thin film with a very small (e.g., a nano-scaled) thickness. In an embodiment, the transition metal compound may have an electrical conductivity of greater than or equal to about 2200 Siemens per centimeter (S/cm), for example, greater than or equal to about 2700 S/cm, greater than or equal to about 3000 S/cm, greater than or equal to about 3500 S/cm, greater than or equal to about 4000 S/cm, greater than or equal to about 5000 S/cm, greater than or equal to about 6000 S/cm, or greater than or equal to about 7000 S/cm, or about 2200 S/cm to about 20,000 S/cm, or about 3000 S/cm to about 15,000 S/cm. The electrically conductive thin film may show even greater electrical conductivity, for example greater than or equal to about 4000 S/cm, greater than or equal to about 5000 S/cm, greater than or equal to about 6000 S/cm, greater than or equal to about 7000 S/cm, greater than or equal to about 8000 S/cm, greater than or equal to about 9000 S/cm, or greater than or equal to about 10,000 S/cm, or about 4000 S/cm to about 30,000 S/cm, or about 5000 S/cm to about 25,000 S/cm, when it includes a monocrystal of the compound. In addition, the electrically conductive thin film may exhibit light transmittance of greater than or equal to about 80%, or about 50% to about 99%, at a thickness of about 10 nm, and computer simulation results of the aforementioned compounds confirm that the compound may exhibit light transmittance of about 90% at a thickness of about 3 nm.

The transition metal compound has a layered crystal structure. In an embodiment, the transition metal compound has a crystal structure wherein a layered unit structure is repeated. In the layered unit structure, the tellurium or the selenium constitutes the upper layer and the lower layer, and a metal element, such as titanium, zirconium, hafnium, vanadium, niobium, or tantalum constitutes an intermediate layer between the upper layer and the lower layer.

In an embodiment, the transition metal compound, such as $TiTe_2$, $NbTe_2$, or $TaTe_2$, may provide electrical conductivity that is comparable to indium tin oxide (ITO), e.g., greater than or equal to about 5000 S/cm, and may provide an electrical conductivity of a metal. Without wishing to be bound by any theory, the transition metal compound is understood to include a high density of electrons confined within the regular and two-dimensional crystal structure and thus may provide improved electrical conductivity. In addition, the sheet-like (e.g., two-dimensional) layered unit structures are linked to each other in the transition metal compound via a van der Waals force or an electrostatic force, and may undergo sliding therebetween. Therefore, the resulting film including such a compound may have flexibility that is greatly improved in comparison with the ITO thin film. Therefore, the thin film including the aforementioned transition metal compound may be utilized as a flexible transparent conductive film (e.g., a transparent electrode), for example, when disposed on a flexible and transparent substrate.

Various efforts have been made to develop a flexible transparent electrode material having high electrical conductivity and being transparent in the visible range. Metals may have high electron density and high electrical conductivity. However, a metal tends to react with oxygen in air to form an oxide on a surface thereof. Most of the metals, except for some precious metals such as Au, Ag, or Pt, may undergo severe oxidation, and thus a metallic electrode material shows a high level of contact resistance. In addition, there has been an attempt to reduce surface contact resistance using a ceramic material having good conductivity and reduced surface oxidation. However, the currently available conductive ceramic materials (such as ITO) have difficulties of an unstable supply of starting materials. Moreover, they may not provide electrical conductivity comparable to that of a metal and their flexibility tends to be poor.

By contrast, the electrically conductive thin film including the aforementioned transition metal compound may provide improved electrical conductivity and high transparency and may also have improved flexibility, and thus may be find its use in a flexible electronic device.

The transition metal compound included in the electrically conductive thin film may have a product of an absorption coefficient ($\alpha$) for light having a wavelength of about 550 nm at 25° C. and a resistivity value ($\rho$) thereof of less than or equal to about 30 ohms per square ($\Omega/\square$), for example, less than or equal to about 20$\Omega/\square$, or about 1$\Omega/\square$ to about 30$\Omega/\square$, or about 2$\Omega/\square$ to about 25$\Omega/\square$. The absorption coefficient and the resistivity may be obtained from a computer simulation. The resistivity ($\rho$) may be obtained by calculating the density of states (DOS) and the band structure around the Fermi level from the crystal structure of the corresponding rare earth element chalcogenide compounds. In addition, the absorption coefficient ($\alpha$) for a certain wavelength is calculated from the dielectric constant of the compound that is obtained by applying the Drude model and considering electron transition due to interband transition.

As to simulation methodology for providing the absorption coefficient ($\alpha$) and the resistivity ($\rho$), it is possible to further refer to the Vienna Ab-initio Simulation Package written by Georg Kresse and Jurgen Furthmuller, Institut fur Materialphysik, Universitat Wien, Sensengasse 8, A-1130 Wien, Austria, Aug. 24, 2005, available at http://cms.mpi-.univie.ac.at/VASP/), which is incorporated herein by reference in its entirety. The aforementioned simulation procedures are summarized in Table 1.

TABLE 1

| Calculation | Simulation level | Calculation/simulation |
|---|---|---|
| Atom electron structure | DFT | Structure optimization Band structure calculation |
| Conductive characteristic | Semi-classical Boltzmann transport (const. $\tau$) | Intraband transition $\sigma \approx (e^2/4\ \pi^3)\ \tau \int dk\ v(k)\ v(k)\ (-\partial\ f/\partial\ \epsilon) =$ $ne^2\ \tau/m_{eff} = ne\ \mu$ $\rho = 1/\sigma$ |
| Dielectric characteristic | DFPT + Drude model | Interband transition $\epsilon(\omega) = \epsilon_D(\omega) + \epsilon_B(\omega) = \epsilon_1(\omega) + i\ \epsilon_2(\omega)$ |
| Optical characteristic Calculate $\rho\ \alpha$ | Ray optics | $n(\omega) + i\ k(\omega) = \epsilon(\omega)^{1/2}$ Absorption coeff. $\alpha = 4\ \pi\ k/\lambda$ |

DFT: density-functional theory
DFPT: density-functional perturbation theory
Drude model: free electron model for a solid
$\sigma$, $\tau$, $m_{eff}$, $\mu$, $\rho$: electrical conductivity, relaxation time, effective mass, mobility, resistivity Hereinbelow, Table 1 is explained in further detail.

In order to calculate a quantum mechanical state of a material, the first-principles calculation (a calculation made from a fundamental equation without using extrinsic parameters) based on the density-functional-theory (DFT) method (a method of solving a quantum mechanical equation by describing the electron distribution using an electron density function instead of a wave function) is performed to calculate the quantum mechanical state of an electron. The VASP (Vienna Ab initio simulation package code, which is a first principles DFT code) is used to calculate the electron state. A candidate material group including a two-dimensional electron gas layer is selected from the Inorganic Crystal Structure Database (ICSD). The atomic structure information for the candidate material is input and the energy level of the electrons is calculated by simulation, and for such electrons, an energy density function and a state density function on a k-space of the electrons are calculated.

The electron structure calculated through the DFT computer simulation provides an E-k diagram (the band structure) and the Density of States (DOS, electron state density, electron state density function per energy unit), making it possible to determine whether the given material is a metallic conductive material (DOS(E)>0) or a semiconductor material (DOS(E)=0) depending on the presence of the DOS on the maximum energy level (E) available to the electrons.

In order to predict the conductivity ($\sigma$) of a metallically conducting material, its conductive characteristics are estimated by introducing a semi-classical Boltzmann transport model. In this case, relaxation time of electrons ($\tau$: duration during which an electron can move without collision) is assumed to be constant (see N. W. Ashcroft and N. D. Mermin, Solid State Physics, Brook Cole (1976), the content of which is incorporated herein in its entirety).

$$\sigma = (e^2/4\pi^3)\tau \int dk v(k) v(k)(-\partial f/\partial E) \quad \text{Boltzmann-Transport}$$

Herein, $\tau$ is a relaxation time of an electron, k is a state of the electron in the k-space, v(k) is a speed of the electron in the k state, f is the Fermi-Dirac distribution function, and E is energy. In this case, v(k) may be calculated from the E-k diagram, and $\sigma/\tau$ may be obtained from the above formula.

The mechanism determining the transmittance or absorption of the conductive material may include intraband absorption due to plasma-like oscillation of free electrons and interband absorption due to band-to-band transition of bound electrons. The quantum computational simulation process considering each of the mechanisms may be obtained by the process as set forth in Table 2.

TABLE 2

| STEP | Category | Calculation | Results | Method (tool) |
|---|---|---|---|---|
| 1 | Optical simulation | Interband transition | $\epsilon B(w) = \epsilon B1(w) + i \epsilon B2(w)$ | DFT (VASP) |
| 2 | Optical simulation | Plasma frequency intraband transition | $\epsilon D(w) = \epsilon D1(w) + i \epsilon D2(w)$ | Boltzmann transport DFT (VASP) or post-processing |
| 3 | Optical simulation | Total dielectric constant refractive index | | Post-processing |
| 4 | Optical simulation | Reflectance absorption coefficient | Plasma freq. reflectance absorption co. transmittance | Post-processing |

Herein, B denotes a band, and D denotes a Drude model.

In this case, the relationships of the dielectric constant (ε), the refractive index (n), and the absorption coefficient ($\alpha$) of a solid are shown as follows. For the dielectric constant, both the interband transition related portion ($\epsilon$(Band)) and the intraband transition related portion ($\epsilon$(Drude)) should be considered.

$$\varepsilon(\omega) = \varepsilon_{(Drude)} + \varepsilon_{(Band)} = \varepsilon_1(\omega) + i\varepsilon_2(\omega)$$

dielectric function $$(n + ik)^2 = \varepsilon(\omega)$$

refraction function $$\alpha(\omega) = 4\pi k/\lambda$$

absorption coefficient

As set forth in the above conductivity calculation, the interband absorption may be calculated through the band structure as calculated in advance, while the intraband absorption by the free electrons is calculated by the simulation as below through the conductivity and optical coefficient calculation based on the Drude modeling (see Jin-woong Kim, Journal of Applied Physics 110, 083501 (2011), the content of which is incorporated herein in its entirety).

CGS UNIT $$\sigma(\omega) = \sigma_0 / [1 - i\omega\tau]$$

AC conductivity $$\sigma_0 = ne^2\tau/m$$

DC conductivity $$\varepsilon(\omega) = 1 + i(4\pi/\omega)\sigma(\omega)$$

$$\omega_p^2 \tau^2 = \sigma_0/\varepsilon_0 \quad (si)$$
$$= 4\pi\sigma_0 \quad (cgs)$$

$$\varepsilon(\omega) = 1 + i(4\pi/\omega)\sigma_0/[1 - i\omega\tau] = 1 - (4\pi\sigma_0/\omega)[i + \omega\tau]$$
$$= 1 - (4\pi\sigma_0/\omega)(-i + \omega\tau)/[1 + (\omega\tau)^2]$$
$$= 1 - (\omega_p\tau)^2/[1 + (\omega\tau)^2] +$$
$$i(\omega_p\tau)^2/[\omega\tau(1 + (\omega\tau)^2)]$$

$$\epsilon_1 = 1 - \frac{\omega_p^2 \tau^2}{1 + \omega^2 \tau^2}$$

$$n = \frac{1}{\sqrt{2}}\left(\epsilon_1 + (\epsilon_1^2 + \epsilon_2^2)^{1/2}\right)^{1/2}$$

$$\epsilon_2 = \frac{\omega_p^2 \tau^2}{\tau\omega(1 + \omega^2\tau^2)}$$

$$K = \frac{1}{\sqrt{2}}\left(-\epsilon_1 + (\epsilon_1^2 + \epsilon_2^2)^{1/2}\right)^{1/2}$$

$\omega$: frequency $\omega_p$: plasma frequency $k$: extinction coefficient

As such, the calculation of the interband absorption and the intraband absorption makes it possible to calculate the dielectric function of the given material, and the optical constants thereof can be simulated therefrom. In the end, the reflectance (R), the absorption coefficient (a), and the transmittance (T) of the given material can be calculated therefrom.

In accordance with the foregoing method, the product of the absorption coefficient ($\alpha$) and the resistivity ($\rho$) for various metal dichalcogenides is compiled in Table 3.

TABLE 3

| Group 4 or Group 5 transition metal dichalcogenide | ρ (Ω-cm) | α (1/cm) | αρ (Ω/□) | t_max (nm) | Rs (Ω/□) at T > 0.90 |
|---|---|---|---|---|---|
| TiS$_2$ | 5.76E−04 | 4.6.E+05 | 264.380 | 2.295 | 2509.3 |
| ZrS$_2$ | 2.37E+04 | 4.9.E+05 | 11689683937.958 | 2.135 | 110949380467.4 |
| HfS$_2$ | 4.91E+03 | 2.9.E+05 | 1427553491.318 | 3.625 | 13549226504.9 |
| VS$_2$ | 3.17E−05 | 2.8.E+05 | 8.857 | 3.767 | 84.1 |
| NbS$_2$ | 2.05E−05 | 1.9.E+05 | 3.983 | 5.432 | 37.8 |
| TaS$_2$ | 1.81E−05 | 1.9.E+05 | 3.501 | 5.441 | 33.2 |
| TiSe$_2$ | 6.98E−05 | 3.0.E+05 | 21.023 | 3.501 | 199.5 |
| ZrSe$_2$ | 4.20E−01 | 5.4.E+05 | 226954.631 | 1.951 | 2154076.7 |
| HfSe$_2$ | 4.29E+01 | 5.9.E+05 | 25307523.013 | 1.784 | 240199308.6 |
| VSe$_2$ | 3.83E−05 | 3.7.E+05 | 14.112 | 2.858 | 133.9 |
| NbSe$_2$ | 2.40E−05 | 2.3.E+05 | 5.497 | 4.596 | 52.2 |
| TaSe$_2$ | 2.16E−05 | 2.0.E+05 | 4.310 | 5.271 | 40.9 |
| TiTe$_2$ | 4.27E−05 | 4.0.E+05 | 17.057 | 2.639 | 161.9 |
| ZrTe$_2$ | 6.02E−05 | 3.1.E+05 | 18.579 | 3.414 | 176.3 |
| HfTe$_2$ | 8.13E−05 | 3.6.E+05 | 29.663 | 2.888 | 281.5 |
| VTe$_2$ | 5.19E−05 | 5.4.E+05 | 27.904 | 1.961 | 264.8 |
| NbTe$_2$ | 3.25E−05 | 3.9.E+05 | 12.519 | 2.734 | 118.8 |
| TaTe$_2$ | 2.61E−05 | 2.9.E+05 | 7.572 | 3.625 | 71.9 |

In Table, 3, "t_max" refers a maximum thickness at which the film may show a transmittance >0.90). As confirmed by Table 3, the transition metal dichalcogenides including TiS$_2$, ZrS$_2$, ZrSe$_2$, HfS$_2$, and HfSe$_2$ have a layered crystal structure and have a high level of specific resistivity calculated by the computer simulation process. In addition, MoS$_2$ has an absorption coefficient of about $10^6$ per centimeter (/cm) in a visible light region, a specific resistivity of about $10^4$ Ωcm, and an electrical conductivity of about $10^{-4}$ S/cm. In addition, when the calculation is made according to the aforementioned method, MoSe$_2$ has an absorption coefficient of about $10^6$/cm in a visible light region, a specific resistivity of about 10 to about 100 Ωcm, and an electrical conductivity of about $10^{-2}$ to $10^{-1}$ S/cm. Therefore, these chalcogenides have a product of the resistivity and the absorption coefficient that is significantly greater than 30.

The product of resistivity (ρ) and absorption coefficient (α) may represent the product of sheet resistance (Rs) and transmittance (−ln T) according to the equation. Accordingly, a compound having a lower value of ρ*α may be advantageous for a material for the electrically conductive thin film.

$e^{-\alpha t} = T$ (i.e., $\alpha t = -\ln T$)

$R_s = \rho/t$

∴ $\rho^*\alpha = Rs^*(-\ln T)$

α: absorption coefficient
ρ: resistivity
T: transmittance (at λ=550 nm)
t: thickness
Rs: sheet resistance The compound included in the electrically conductive thin film may have a product of the absorption coefficient and the resistivity (i.e., Rs*(−ln T)) of less than or equal to about 30, for example, less than or equal to about 20, or about 1 to about 30, or about 2 to about 25, so as to provide an electrically conductive thin film having high conductivity and excellent transparency (i.e., low sheet resistance and high light transmittance).

The electrically conductive thin films according to the embodiments include an inorganic material including a metal and a non-metal element, but may have very high conductivity even at a thickness of about 1 nm to about 50 nm, or about 2 to about 30 nm. Without being bound by any particular theory, it is believed that the aforementioned electrically conductive thin films may exhibit very high conductivity with high transparency as they include electrons that are two-dimensionally confined in the layered crystal structure and may move with high mobility even in a thin film having a very small thickness. Therefore, the resulting thin film may provide high transparency and high electrical conductivity. In addition, the electrically conductive thin film of the compound having a layered crystal structure has an interlayer sliding phenomenon and thus may provide improved flexibility. In an embodiment a 10 nm thick electrically conductive thin film on a 150 μm thick polyethylene substrate can be bent 180° around a rod having a diameter of 5 centimeter (cm) with less than a 5% loss in electrical conductivity. In another embodiment a 20 nm thick electrically conductive thin film on a 150 μm thick polyethylene substrate can be bent 180° around a rod having a diameter of 5 cm with less than a 5% loss in electrical conductivity. In another embodiment a 50 nm thick electrically conductive thin film on a 150 μm thick polyethylene substrate can be bent 180° around a rod having a diameter of 5 cm with less than a 5% loss in electrical conductivity.

In another embodiment a 10 nm thick electrically conductive thin film on a 150 μm thick polyethylene substrate can be bent 180° around a rod having a diameter of 1 cm with less than a 5% loss in electrical conductivity. In another embodiment a 20 nm thick electrically conductive thin film on a 150 μm thick polyethylene substrate can be bent 180° around a rod having a diameter of 1 cm with less than a 5% loss in electrical conductivity. In another embodiment a 50 nm thick electrically conductive thin film on a 150 μm thick polyethylene substrate can be bent 180° around a rod having a diameter of 1 cm with less than a 5% loss in electrical conductivity.

In another embodiment a 10 nm thick electrically conductive thin film on a 150 μm thick polyethylene substrate can be bent 180° around a rod having a diameter of 0.5 cm with less than a 5% loss in electrical conductivity. In another embodiment a 20 nm thick electrically conductive thin film on a 150 μm thick polyethylene substrate can be bent 180° around a rod having a diameter of 0.5 cm with less than a 5% loss in electrical conductivity. In another embodiment a 50 nm thick electrically conductive thin film on a 150 μm thick polyethylene substrate can be bent 180° around a rod having a diameter of 0.5 cm with less than a 5% loss in electrical conductivity.

According to an embodiment, the layered crystal structure of the transition metal dichalcogenide compound represented by Chemical Formula 1 or Chemical Formula 2 may belong to a hexagonal system with a space group of P-3m1 (164) or a monoclinic system with a space group of C12/m1 (12). For the transition metal dichalcogenide compound represented by Chemical Formula 1 or Chemical Formula 2, the crystal system and its space group may be summarized as shown in Table 4.

TABLE 4

| | Crystal system/Space Group |
|---|---|
| $VSe_2$ | Hexagonal/P-3m1/164 |
| $TaSe_2$ | Hexagonal/P63mmc/194 |
| $TiTe_2$ | Hexagonal/P-3m1/164 |
| $ZrTe_2$ | Hexagonal/P-3m1/164 |
| $HfTe_2$ | Hexagonal/P-3m1/164 |
| $VTe_2$ | Hexagonal/P-3m1/164 |
| $NbTe_2$ | Monoclinic/C12/m1/12 |
| $TaTe_2$ | Monoclinic/C12/m1/12 |

According to an embodiment, the electrically conductive thin film may be produced by preparing a starting material of a transition metal dichalcogenide compound represented by Chemical Formula 1 or Chemical Formula 2, a polycrystalline or monocrystalline bulk material prepared from the same, or a powder obtained from the bulk material, and conducting an appropriate method such as vapor deposition and the like with the starting material, the prepared bulk material, or a powder thereof to form a conductive thin film (e.g., a transparent conductive layer). Alternatively, the electrically conductive thin film may be obtained by liquid phase exfoliation of the bulk material powder to provide nanosheets and forming the obtained nanosheets into a thin film.

The starting material of the transition metal compound may include each element or a compound including each element. For example, the starting material may include titanium (Ti), zirconium (Zr), hafnium (Hf), vanadium (V), tantalum (Ta), or niobium (Nb). For example, the starting material may include selenium or tellurium. For example, the starting material may include a compound of the above metal and selenium or tellurium (e.g., TiSe, TiTa, and the like).

The polycrystalline bulk material may be prepared from the starting material (e.g., a mixture of a metal powder and a tellurium or selenium powder at a ratio of 1:2) according to a quartz ampoule method, an arc melting method, a solid-state reaction method, and the like. For example, the quartz ampoule method includes introducing the starting material, e.g., an element, into a quartz tube or an ampoule made of a metal, sealing the same under vacuum, and heating the same to perform a solid-phase reaction or a melting process. The arc melting method includes introducing a starting material into a chamber, performing an arc discharge process under an inert gas (e.g., nitrogen, argon, etc.) atmosphere to melt the starting material element, and solidifying the same. The solid-state reaction method may include mixing and pelletizing the starting material powder and heat-treating the obtained pellet. In some embodiments, the solid-state reaction method may include heat treating the obtained mixture and pelletizing and sintering the same.

The obtained polycrystalline bulk material may be subjected to a sintering process to provide a highly densified product. The highly densified product may be used as a specimen for measuring electrical conductivity. Such a densification process may be performed by a hot pressing method, a spark plasma sintering method, a hot forging method, or the like. The hot pressing method includes applying the pulverized compound into a mold having a predetermined shape, and forming the same at a high temperature of, for example, about 300° C. to about 800° C. under a high pressure of, for example, about 1 megapascals (MPa) to about 300 megapascals (MPa), for example, 30 MPa to 300 MPa. The spark plasma sintering method includes applying the pulverized compound with high voltage current under a high pressure, for example, with a current of about 50 amperes (A) to about 500 A under a pressure of about 30 MPa to about 300 MPa to sinter the material within a short period of time. The hot forging method may include compressing and sintering the powder compound at a high temperature of, for example, about 300° C. to about 700° C.

The monocrystalline material may be obtained by preparation of a crystal ingot or by growth of a monocrystal. The crystal ingot may be obtained by heating a congruent melting material to a temperature higher than the melting point of the material and then slowly cooling the same. For example, the starting material mixture may be introduced into a quartz ampoule, melted after sealing the ampoule under vacuum, and then the melted mixture is slowly cooled to provide a crystal ingot. The crystal grain size may be controlled by adjusting the cooling speed of the melted mixture. The growth of the monocrystal may be performed by a metal flux method, a Bridgman method, an optical floating zone method, a vapor transport method, or the like. In the metal flux method, a starting material mixture is put into a crucible and treated at a high temperature to grow a crystal under an atmosphere wherein the starting material elements may form a growing crystal at a high temperature. In the metal flux method, the starting material powder is melted in a crucible together with additional flux at a high temperature, and slowly cooled so as to grow crystals at a certain temperature. The Bridgman method includes introducing the starting material element into a crucible and heating the same at a high temperature until the starting material element is dissolved at the terminal end of the crucible, and then slowly moving the high temperature zone and locally dissolving the sample to pass the entire sample through the high temperature zone, so as to grow a crystal. The optical floating zone method is a method including forming a starting material element into a rod-shaped seed rod and a feed rod, locally melting the sample at a high temperature by focusing lamp light on the feed rod, and slowly pulling up the melted part to grow a crystal. The vapor transport method includes introducing the starting material, e.g., an element, into the bottom part of a quartz tube and heating the starting material, and maintaining the upper part of the quartz tube at a low temperature to perform a solid-phase reaction with a vaporized starting material at a low temperature and thereby to grow a crystal. The electrical conductivity of the obtained monocrystalline material may be measured according to a direct current (DC) 4-terminal method.

The obtained polycrystalline or monocrystalline bulk material may be pulverized to provide a crystalline powder. The pulverization may be performed by any suitable method such as a ball milling without particular limitation. After the pulverization, the powder having a uniform size may be provided using, for example, a sieve.

The obtained polycrystalline or monocrystalline bulk material may be used as a target of vapor deposition to provide a thin continuous film (i.e., an electrically conductive thin film) including the compound. The vapor deposition may be performed by a physical vapor deposition method such as a thermal evaporation and sputtering, chemical vapor deposition (CVD), atomic layer deposition (ALD), or pulsed laser deposition. The deposition may be performed using any known or commercially available apparatus. The deposition condition may vary with the types of the compound and the deposition method, and is not particularly limited.

According to another embodiment, the bulk material of the above compound or the powder thereof may be subjected to liquid phase exfoliation to be prepared as a plurality of nanosheets, which are then brought into contact with each other so as to provide an electrical connection, thereby providing an electrically conductive thin film.

In the liquid phase exfoliation, the bulk material or the powder thereof may be subjected to ultra-sonication in an appropriate solvent. Examples of the solvent suitable for the liquid phase exfoliation may include, but are not limited to, water, an alcohol (e.g., isopropyl alcohol, ethanol, or methanol), N-methyl pyrrolidone (NMP), hexane, benzene, dichlorobenzene, toluene, chloroform, diethylether, dichloromethane (DCM), tetrahydrofuran (THF), ethylacetate (EtOAc), acetone, dimethyl formamide (DMF), acetonitrile (MeCN), dimethyl sulfoxide (DMSO), ethylene carbonate, propylene carbonate, γ-butyrolactone, γ-valerolactone, a perfluorinated aromatic solvent (e.g., hexafluorobenzene, octafluorotoluene, pentafluorobenzonitrile, and pentafluoropyridine), or a combination thereof.

The solvent may further include an additive such as a surfactant in order to facilitate the exfoliation and prevent the exfoliated nanosheets from being agglomerated. Examples of the surfactant may include sodium dodecyl sulfate (SDS) and sodium dodecyl benzenesulfonate (SDBS).

The ultrasonication may be performed by using any suitable ultrasonication device, and the conditions thereof (e.g., ultrasonication time) are not particularly limited, and may be appropriately selected considering a solvent used and a powder concentration in the solvent. For example, the ultrasonication may be performed for greater than or equal to about 1 hour, for example, for about 1 hour to about 100 hours, but is not limited thereto. The powder concentration in the solvent may be greater than or equal to about 0.01 grams per milliliter (g/mL), for example, within a range of about 0.01 g/mL to about 1 g/L, but is not limited thereto.

In order to facilitate the exfoliation, lithium atoms may be intercalated into the compound having a layered crystal structure. According to an embodiment, the compound is immersed in an alkyl lithium compound (e.g., butyllithium) solution in an aliphatic hydrocarbon solvent such as hexane to intercalate lithium atoms into the compound, and the obtained product is subjected to ultrasonication to provide a plurality of nanosheets including the compound. For example, by putting the obtained product in water, water and the intercalated lithium ions may react to generate hydrogen between layers of the crystal structure, so as to accelerate the interlayer separation. The obtained nanosheets are separated according to an appropriate method (e.g., centrifugation) and washed.

In the electrically conductive thin film including the nanosheets (e.g., nanoflakes), the nanosheets physically contact one another to provide an electrical connection. The length of nanosheets is not particularly limited, and may be appropriately selected. For example, the nanosheet may have a length of less than or equal to about 500 μm, for example, of about 10 nm to about 10 μm, but is not limited thereto. The nanosheets may have a thickness of less than or equal to about 100 nm, or about 1 to about 100 nm. The obtained film may have coverage of greater than or equal to about 20%, for example, of greater than or equal to about 50%. The obtained film may have high transmittance (e.g., greater than or equal to about 80%, or greater than or equal to about 85%) when the thickness is less than or equal to about 20 nm, for example, less than or equal to about 5 nm. The formation of the film using a nanosheet may be conducted in any suitable method. For example, the formation of the film may be performed by dip coating, spray coating, printing after forming an ink or a paste, and the like.

According to an embodiment, the manufactured nanosheets are added to deionized water, and the resultant dispersion is ultrasonicated again. An organic solvent that is not miscible with water (e.g., an aromatic hydrocarbon such as xylene or toluene) is added to the ultrasonicated dispersion. When the mixture thus obtained is shaken, a thin film including nanosheets is formed at the interface between the water and the organic solvent. When a clean, wetted, and oxygen plasma-treated glass substrate is slightly dipped to the interface and taken out, the thin film including nanosheets is spread out on the substrate at the interface. The thickness of the thin film may be selected by controlling a concentration of the nanosheets per area on the surface of the water/organic solvent and a speed/angle when the substrate is taken out.

The electrically conductive thin film provides high conductivity, enhanced light transmittance, and excellent flexibility, and thus may replace an electrode including a transparent conductive oxide such as ITO, ZnO, and the like and a transparent film including an Ag nanowire.

Another embodiment provides an electronic device including the above electrically conductive thin film. The electrically conductive thin film is the same as described above. The electronic device may include, for example, a flat panel display (e.g., LCD, LED, and OLED), a touch screen panel, a solar cell, an e-window, a heat mirror, a transparent transistor, or a flexible display, but is not limited thereto.

FIG. 5 is a cross-sectional view of an organic light emitting diode device including an electrically conductive thin film according to an embodiment.

An organic light emitting diode device according to an embodiment includes a substrate 10, a lower electrode 20, an upper electrode 40 facing the lower electrode 20, an emission layer 30 interposed between the lower electrode 20 and the upper electrode 40, and an auxiliary layer (50).

The substrate 10 may comprise an inorganic material such as glass, or an organic material such as polycarbonate, polymethyl methacrylate, polyethylene terephthalate, polyethylene naphthalate, polyamide, polyethersulfone, or a combination thereof, or a silicon wafer.

One of the lower electrode 20 and the upper electrode 40 is a cathode and the other is an anode. For example, the lower electrode 20 may be an anode and the upper electrode 40 may be a cathode.

At least one of the lower electrode 20 and the upper electrode 40 may be a transparent electrode. When the lower electrode 20 is a transparent electrode, the organic light emitting diode device may have a bottom emission structure in which light is emitted toward the substrate 10, while when the upper electrode 40 is a transparent electrode, the organic light emitting diode device may have a top emission structure in which light is emitted away from the substrate 10. In addition, when the lower electrode 20 and upper electrode 40 are both transparent electrodes, light may be emitted toward the substrate 10 and away from the substrate 10.

The transparent electrode may be prepared from the above electrically conductive thin film. Details for the electrically conductive thin film are the same as set forth above. The transparent electrically conductive film may be suitable for the use as an organic light emitting diode (OLED) cathode. The electrically conductive thin film may be used to replace a LiF/Al or MgAg alloy cathode.

The example of applying the electrically conductive thin film to an organic light emitting diode device is illustrated above, and the electrically conductive thin film may be used as an electrode for all electronic devices including a transparent electrode without a particular limit, for example, a pixel electrode and/or a common electrode for a liquid crystal display (LCD), an anode and/or a cathode for an organic light emitting diode device, a display electrode for a plasma display device, and a transparent electrode for a touch screen panel device.

Hereinafter, the embodiments are illustrated in more detail with reference to examples. These examples, however, are not in any sense to be interpreted as limiting the scope of this disclosure.

EXAMPLES

Example 1: Preparation of $TiTe_2$ Polycrystalline Sintered Body

Figure 1:
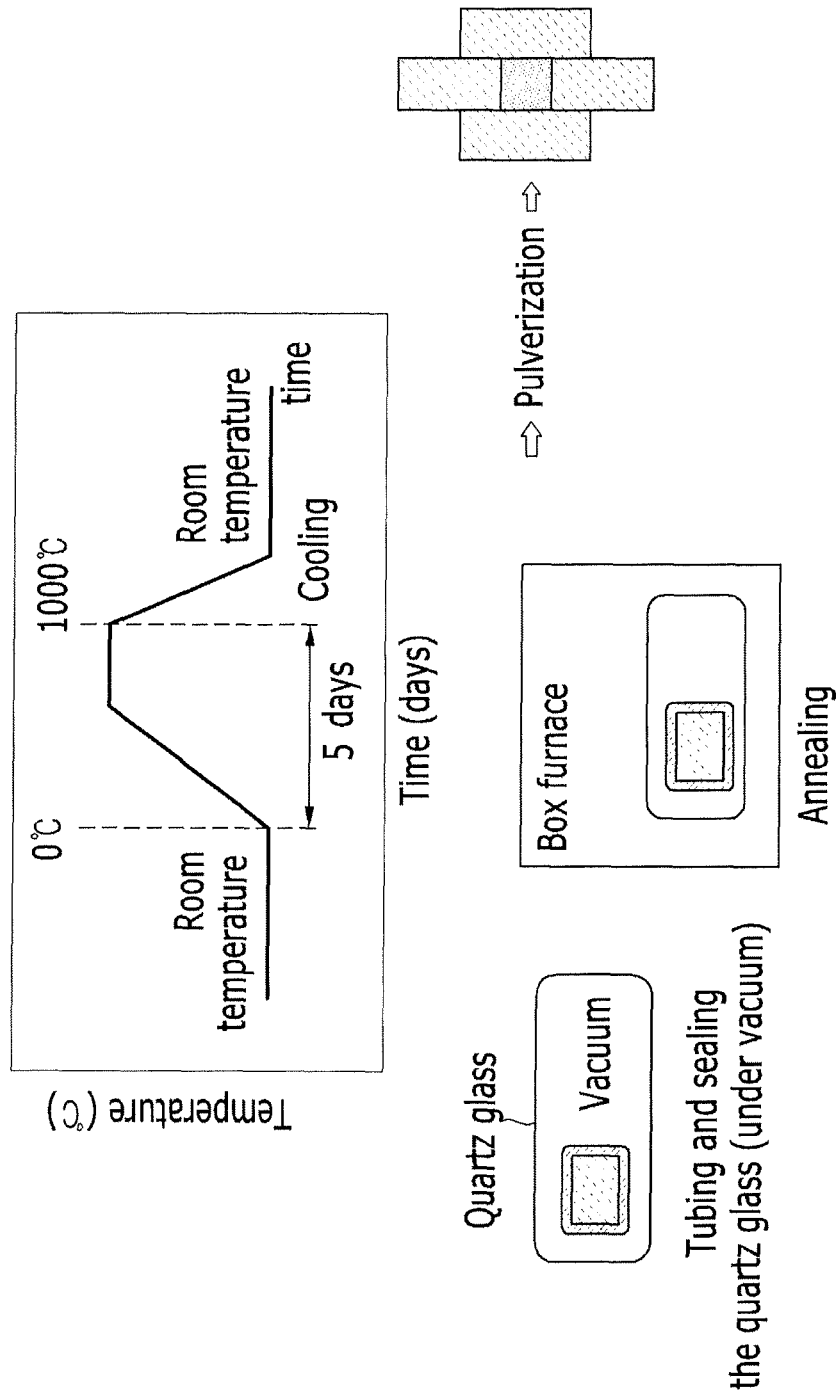
FIG. 1 is a schematic illustration of a process used in the Examples to prepare a polycrystalline sintered body.

In a glove box, 0.05 mole of elemental titanium (Ti) powder (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture. The prepared mixture is introduced into a quartz glass tube, and the tube is sealed under a vacuum. The quartz glass tube is introduced into a box furnace and heated to 1000° C. over one day, and is maintained at the same temperature for four days and then slowly cooled to room temperature (a solid-state method), as illustrated in FIG. 1.

The obtained sample is pulverized and is subjected to a spark-plasma sintering (SPS) process using SPS equipment (manufactured by Fuji Electronic Industrial Co., Ltd. Model name: Dr. Sinter) at a temperature of 600° C., 700° C., 800° C., and 900° C., under a pressure of 70 MPa or 80 MPa.

For the obtained sintered body, electrical conductivity is measured using ULVAC-Riko ZEM-3 equipment according to the DC 4 terminal method under the conditions of room temperature/normal pressure, and the results are compiled in Table 5.

For some of the sintered bodies thus prepared, X-ray diffraction analysis is made and the results thereof are shown in FIG. 6A to FIG. 6C, respectively.

Example 2: Preparation of $ZrTe_2$ Polycrystalline Sintered Body

ZrTe2 polycrystalline sintered bodies are prepared in the same manner set forth in Example 1, except that in a glove box, 0.05 mole of elemental zirconium (Zr) powder (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture.

The electrical conductivity of each of the sintered bodies thus prepared is measured and the results are compiled in Table 5.

Example 3: Preparation of $HfTe_2$ Polycrystalline Sintered Body

HfTe2 polycrystalline sintered bodies are prepared in the same manner set forth in Example 1, except that in a glove box, 0.05 mole of elemental hafnium (Hf) (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture.

The electrical conductivity of each of the sintered bodies thus prepared is measured and the results are compiled in Table 5.

Example 4: Preparation of $VTe_2$ Polycrystalline Sintered Body

VTe2 polycrystalline sintered bodies are prepared in the same manner set forth in Example 1, except that in a glove box, 0.05 mole of elemental vanadium (V) (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture.

The electrical conductivity of each of the sintered bodies thus prepared is measured and the results are compiled in Table 5.

Example 5: Preparation of $NbTe_2$ Polycrystalline Sintered Body

NbTe2 polycrystalline sintered bodies are prepared in the same manner set forth in Example 1, except that in a glove box, 0.05 mole of elemental Niobium (Nb) (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture.

The electrical conductivity of each of the sintered bodies thus prepared is measured and the results are compiled in Table 5.

Example 6: Preparation of $TaTe_2$ Polycrystalline Sintered Body

TaTe2 polycrystalline sintered bodies are prepared in the same manner set forth in Example 1, except that in a glove box, 0.05 mole of elemental tantalum (Ta) (purity: 99.9%, manufacturer: Sigma-Aldrich Co., Ltd.) is mixed with 0.10 mole of elemental tellurium (granular, purity: 99.99%, manufacturer: Sigma-Aldrich Co., Ltd.) to provide a mixture and that the mixture is annealed at a temperature of 800° C., and then is subjected to the SPS process at 600° C. and 70 MPa, at 700° C. and 70 MPa, at 800° C. and 70 MPa, or at 900° C. and 80 MPa, respectively.

The electrical conductivity of each of the sintered bodies thus prepared is measured and the results are compiled in Table 5.

For some of the sintered bodies thus prepared, X-ray diffraction analysis is made and the results thereof are shown in FIG. 2A to 2C, respectively.

Example 7: Preparation of VSe$_2$ Polycrystalline Sintered Body

VSe2 polycrystalline sintered bodies are prepared in the same manner set forth in Example 1, except that in a glove box, 0.05 mole of elemental vanadium (V) (purity: 99.9%, manufacturer: Sigma-Aldrich Co., Ltd.) is mixed with 0.10 mole of elemental selenium (granular, purity: 99.99%, manufacturer: Sigma-Aldrich Co., Ltd.) to provide a mixture.

The electrical conductivity of each of the sintered bodies thus prepared is measured and the results are compiled in Table 5.

Example 8: Preparation of TaSe$_2$ Polycrystalline Sintered Body

TaSe$_2$ polycrystalline sintered bodies are prepared in the same manner set forth in Example 1, except that in a glove box, 0.05 mole of elemental tantalum (Ta) (purity: 99.9%, manufacturer: Sigma-Aldrich Co., Ltd.) is mixed with 0.10 mole of elemental selenium (granular, purity: 99.99%, manufacturer: Sigma-Aldrich Co., Ltd.) to provide a mixture and that the mixture is annealed at a temperature of 800° C., and then is subjected to the SPS process at 600° C. and 70 MPa, at 700° C. and 70 MPa, at 800° C. and 70 MPa, or at 900° C. and 80 MPa.

The electrical conductivity of each of the sintered bodies thus prepared is measured and the results are compiled in Table 5.

For some of the sintered bodies thus prepared, X-ray diffraction analysis is made and the results thereof are shown in FIG. 3, respectively.

Comparative Example 1: Preparation of NbS$_2$ Polycrystalline Sintered Body

NbS2 polycrystalline sintered bodies are prepared in the same manner set forth in Example 1, except that in a glove box, 0.05 mole of elemental niobium (Nb) (purity: 99.9%, manufacturer: Sigma-Aldrich Co., Ltd.) is mixed with 0.10 mole of elemental sulfur (purity: 99.99%, manufacturer: Sigma-Aldrich Co., Ltd.) to provide a mixture.

The electrical conductivity of each of the sintered bodies thus prepared is measured and the results are compiled in Table 5.

Comparative Example 2: Preparation of TaS$_2$ Polycrystalline Sintered Body

TaS2 polycrystalline sintered bodies are prepared in the same manner set forth in Example 1, except that in a glove box, 0.05 mole of elemental tantalum (Ta) (purity: 99.9%, manufacturer: Sigma-Aldrich Co., Ltd.) is mixed with 0.10 mole of elemental sulfur (purity: 99.99%, manufacturer: Sigma-Aldrich Co., Ltd.) to provide a mixture.

The electrical conductivity of each of the sintered bodies thus prepared is measured and the results are compiled in Table 5.

Comparative Example 3: Preparation of TiSe$_2$ Polycrystalline Sintered Body TiSe2 polycrystalline sintered bodies are prepared in the same manner set forth in Example 1, except that in a glove box, 0.05 mole of elemental titanium (Ti) (purity: 99.9%, manufacturer: Sigma-Aldrich Co., Ltd.) is mixed with 0.10 mole of elemental selenium (purity: 99.99%, manufacturer: Sigma-Aldrich Co., Ltd.) to provide a mixture and that the mixture is annealed at a temperature of 700° C., and then is subjected to the SPS process at a temperature of 600° C., 700° C., or 800° C. under a pressure of 70 MPa, or at a temperature of 900° C. under a pressure of 80 MPa, respectively. For each of the sintered bodies thus prepared, X-ray diffraction analysis is made and the results thereof are shown in FIG. 7A to 7D, respectively.

The electrical conductivity of each of the sintered bodies thus prepared is measured and the results are compiled in Table 5.

TABLE 5

| | Transition metal compound | Electrical conductivity (S/cm) | | | |
|---|---|---|---|---|---|
| | | SPS 70 MPa 600° C. | SPS 70 MPa 700° C. | SPS 70 MPa 800° C. | SPS 80 MPa 900° C. |
| Example 1 | TiTe$_2$ | 9396 | 10556 | 8827 | 7945 |
| Example 2 | ZrTe$_2$ | 2800 | 3182 | 3506 | 1390 |
| Example 3 | HfTe$_2$ | 2240 | 2469 | 2748 | 2686 |
| Example 4 | VTe$_2$ | 2380 | 1722 | — | — |
| Example 5 | NbTe$_2$ | 5750 | 6002 | — | — |
| Example 6 | TaTe$_2$ | 4215 | 4448 | 4127 | 3806 |
| Example 7 | VSe$_2$ | 2214 | 3432 | 3642 | 2300 |
| Example 8 | TaSe$_2$ | 2169 | 2038 | 2737 | 2400 |
| Comp. Example 1 | NbS$_2$ | 705 | 1591 | 1940 | — |
| Comp. Example 2 | TaS$_2$ | 441 | 485 | 495 | 811 |
| Comp. Example 3 | TiSe$_2$ | 271 | 653 | 675 | 1142 |

Example 9: Preparation of TiTe$_2$ Monocrystal

In a glove box, 0.05 mole of elemental Ti powder (purity: 99.99%, manufacturer: Sigma-Aldrich Co., Ltd.) is mixed with 0.10 mole of elemental tellurium (purity: 99.99%, manufacturer: Sigma-Aldrich Co., Ltd.) to provide a mixture. The prepared mixture is introduced into a quartz glass tube, and the tube is sealed under a vacuum condition. The quartz glass tube is put into a box furnace and heated to 900° C. at a rate of 100° C./h, and is maintained at this temperature for 24 hours, and then the resulting melted product is maintained at 1300° C. for a time period of about 6 hours. Then, the temperature of the melted product is decreased to 1200° C. over 48 hours to grow a crystal ingot. The grown crystal ingot is cooled to room temperature. The temperature profile of this process is illustrated in FIG. 4.

It is confirmed that the monocrystal obtained by this process may have a grain with a size of 1 millimeter (mm) or larger.

The electrical conductivity of the obtained monocrystal is measured using ULVAC-Riko ZEM-3 equipment under the room temperature/normal pressure condition according to the DC 4 terminal method. The results confirm that the prepared monocrystal has a high level of electrical conductivity of 18,000 S/cm.

Example 10: Manufacture of TiTe$_2$ Thin Film

Pulsed laser deposition (PLD) is conducted on a MgO substrate under the following conditions using the sintered body prepared from Example 1 as a target and using a KrF laser.

PLD device: Pioneer 130, Neocera
Output: 1.5 J/cm$^2$
Time: 20 min
Substrate temperature: 600° C.

Vacuum degree: $2*10^{-6}$ Pa

The obtained TiTe$_2$ deposition film has a thickness of about 20 nm.

Example 11: Manufacture of Thin Film Including TiTe$_2$ Nanosheets

The TiTe2 sintered body prepared from Example 1 is pulverized and 0.1 g of the obtained powder is dispersed in 1 liter (L) of NMP. The resulting dispersion is ultrasonicated for one hour. By the ultrasonication, separation occurs between the layers and thereby a dispersion including TiTe2 nanosheets is obtained.

Then, the nanosheets thus prepared are separated from the dispersion via centrifugation and washed with water and then centrifuged again.

The obtained nanosheet precipitate is placed in a vial and added with 3 mL of deionized water and ultrasonicated. 2-3 mL of toluene is added thereto, and the vial is stirred to provide a thin film including nanosheets at the interface between the aqueous layer and the toluene layer. A glass substrate treated with oxygen plasma is slightly dipped into the interface and pulled up so that a film including the PdTe2 nanosheets present at the interface is spread on the glass substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrically conductive thin film, comprising a plurality of nanosheets, wherein the plurality of nanosheets comprises:
    a compound represented by Chemical Formula 1 or Chemical Formula 2 and having a layered crystal structure $$M^1Te_2 \qquad \text{Chemical Formula 1}$$

wherein M$^1$ is zirconium, hafnium, vanadium, tantalum, or niobium; or $$M^2Se_2 \qquad \text{Chemical Formula 2}$$

wherein M$^2$ is vanadium or tantalum,
    wherein the electrically conductive thin film has a thickness of less than or equal to about 20 nanometers,
    wherein the electrically conductive thin film has a transmittance of greater than or equal to about 80% for light having a wavelength of about 550 nanometers, and
    wherein the film has an electrical conductivity of greater than or equal to about 2200 Siemens per centimeter.

2. The electrically conductive thin film of claim 1, wherein the compound comprises TaTe$_2$.

3. The electrically conductive thin film of claim 1, wherein the film has an electrical conductivity of greater than or equal to about 2700 Siemens per centimeter.

4. The electrically conductive thin film of claim 1, wherein for the compound, a product of an absorption coefficient for light having a wavelength of about 550 nanometers and a resistivity value is less than or equal to about 20 ohms per square.

5. The electrically conductive thin film of claim 1, wherein the layered crystal structure belongs to a hexagonal system in space group P-3m1 or a monoclinic system in space group C12/m1.

6. The electrically conductive thin film of claim 1, which comprises a monocrystal of the compound.

7. The electrically conductive thin film of claim 1, wherein the nanosheets contact one another to provide an electrical connection.

8. The electrically conductive thin film of claim 1, wherein the electrically conductive thin film has a coverage of greater than or equal to about 50%.

9. The electrically conductive thin film of claim 1, which has transmittance of greater than or equal to about 85 percent for light having a wavelength of about 550 nm.

10. The electrically conductive thin film of claim 1, wherein when in a form of a 20 nanometer thick film on a 150 micrometer thick polyethylene substrate, the film and the substrate can be bent 180° around a rod having a diameter of 5 centimeters with less than a 5% loss in electrical conductivity.

11. The electrically conductive thin film of claim 1, wherein the M$^1$ is zirconium, hafnium, vanadium, or tantalum.

12. An electronic device comprising an electrically conductive thin film comprising a plurality of nanosheets, wherein the plurality of nanosheets comprises:
    a compound represented by Chemical Formula 1 or Chemical Formula 2 and having a layered crystal structure $$M^1Te_2 \qquad \text{Chemical Formula 1}$$

wherein M$^1$ is zirconium, hafnium, vanadium, tantalum, or niobium; or $$M^2Se_2 \qquad \text{Chemical Formula 2}$$

wherein M$^2$ is vanadium or tantalum,
    wherein the electrically conductive thin film has a thickness of less than or equal to about 20 nanometers,
    wherein the electrically conductive thin film has a transmittance of greater than or equal to about 80% for light having a wavelength of about 550 nanometers, and
    wherein the film has an electrical conductivity of greater than or equal to about 2200 Siemens per centimeter.

13. The electronic device of claim 12, wherein the electrically conductive thin film comprises TaTe$_2$.

14. The electronic device of claim 12, wherein the electrically conductive thin film has electrical conductivity of greater than or equal to about) 2700 Siemens per centimeter.

15. The electronic device of claim 12, wherein for the compound, a product of an absorption coefficient for light having a wavelength of about 550 nanometers and a resistivity value is less than or equal to about 20 ohms per square.

16. The electronic device of claim 12, wherein the electrically conductive thin film comprises a compound having a layered crystal structure that belongs to a hexagonal system in space group P-3m1 or a monoclinic system in space group C12/m1.

17. The electronic device of claim 12, wherein the electrically conductive thin film comprises a monocrystal of the compound.

18. The electronic device of claim 12, wherein the nanosheets contact one another to provide an electrical connection.

19. The electronic device of claim 12, wherein the electrically conductive thin film has a coverage of greater than or equal to about 50%.

20. The electronic device of claim 12, wherein the electronic device is a flat panel display, a touch screen panel, a solar cell, an e-window, an electrochromic mirror, a heat mirror, a transparent transistor, or a flexible display.

21. The electronic device of claim 12, wherein the electrically conductive thin film has transmittance of greater than or equal to about 85 percent for light having a wavelength of about 550 nanometers.

* * * * *